United States Patent [19]

Dwyer

[11] Patent Number: 4,669,418
[45] Date of Patent: Jun. 2, 1987

[54] OPTICAL COATING APPARATUS

[75] Inventor: David J. Dwyer, Hopkinton, Mass.

[73] Assignee: GTE Laboratories Incorporated, Waltham, Mass.

[21] Appl. No.: 864,378

[22] Filed: May 19, 1986

[51] Int. Cl.⁴ ............................................. B05C 11/00
[52] U.S. Cl. ................... 118/664; 118/715; 118/724; 118/725
[58] Field of Search ................ 118/664, 715, 724, 725

[56] References Cited

U.S. PATENT DOCUMENTS

| | | | |
|---|---|---|---|
| 4,024,291 | 5/1977 | Wilmanns | 118/664 |
| 4,207,835 | 6/1980 | Schwiecker | 118/664 |
| 4,207,836 | 6/1980 | Nonaka | 118/664 |

FOREIGN PATENT DOCUMENTS

349766  6/1970  U.S.S.R. .............................. 118/664

Primary Examiner—Richard Bueker
Attorney, Agent, or Firm—Fred Fisher

[57] ABSTRACT

Apparatus for evaporating numerous layers of various substances upon a substrate includes square witness chips transparent to a specific beam of radiation. A witness chip holder, having a cylindrical base, has an axial hole vertically disposed from its central axis. The axial hole has a cross-sectional shape that corresponds to the external configuration of an octagram wherein recesses of right-angled vertices of the octagram are formed in the axial hole. Each witness chip is rotatably stacked within alternate formed verticular recesses of the octagrammatic hole. A drum with a square hole at its base has a cylindrical recess for receiving the cylindrical base of the witness chip holder, thus providing for reciprocating movement therebetween. The square hole is slightly larger than the witness chip so that the lowermost witness chip of a stack of chips is held at its vertices by the base of the drum. A geneva mechanism rotates the holder with respect to the drum so as to eject one witness chip at a time through the square hole. The substrate and the lowermost witness chip are simultaneously evaporated a substance. A radiation beam is either directed through the stacked witness chips in the holder or reflected from the lowermost chip. Specific transmissibility of radiation through the stacked chips or reflected radiation of the lowermost chip is detected. A toroidal-shaped heating element forming an annulus wrapped with sets of heating wire has the heating wire provided with turns of wire that are adjacent to each other, oriented parallel to each other.

20 Claims, 10 Drawing Figures

OPTICAL COATING WITNESS CHIP CHANGER
AND HEATER

OPTICAL COATING WITNESS CHIP CHANGER
AND HEATER

DUODECIPLOIDAL
RECESSES

Fig. 7.

VIGINTIPLOIDAL
RECESSES

Fig. 9.

SEXADECIPLOIDAL RECESSES
FORMED FROM VERTICES OF A
SEXADECIGRAM

OPTICAL COATING APPARATUS

BACKGROUND OF THE INVENTION

1. Field of the Invention

This invention relates to optical coating apparatus and, in particular, to apparatus for evaporating a plurality of layers of various substances upon a substrate, utilizing an optical coating witness chip changer and a heater. Accordingly, it is a general object of this invention to provide new and improved apparatus of such character.

2. General Background

The apparatus described herein is utilized for making multilayer coatings for optical devices. The apparatus provides the operator with a means of remotely changing witness chips that are used to monitor the optical coatings and utilizes an improved heater for maintaining substrate and witness chip changer temperature.

Optical coatings are traditionally applied by resistance or electron beam evaporation techniques at elevated temperatures and in a vacuum. Because optical coatings characteristics are particularly sensitive to thickness, and the rate of application is affected by numerous variables, such as temperature, contaminants in the vacuum system, sweep rate of application or characteristics of the electron gun, it is desirable to monitor the coating characteristics as coating is applied. It is known that a reliable technique is to optically monitor the interference characteristics of the coating as it is applied to a witness chip. Most optical coatings require continuous application of multiple layers and several materials. Thus, to provide a fresh monitoring surface, frequent changes of the witness chip are desirable during the application of a particular coating. As coatings are applied in layers of $\frac{1}{4}$, $\frac{1}{2}$, $\frac{3}{4}$ or full wavelength, and some cases an $\frac{1}{8}$ of a wavelength, a new witness chip for each layer is highly desirable.

The requirements for a witness chip changer/heater, wherein a substrate may be coated with 100 layers of material depending upon the end usage, are as follows:

1. Because vacuum should not be released during application of successive layers to avoid danger of contamination to the coating, the changer should be reliably operated remote to the vacuum system.

2. Because the optical characteristics of many coatings vary significantly with temperature at the time of application, the witness chip should be heated to the same temperature as the substrates.

3. Coating characteristics vary with distance. Thus, the witness chip should be positioned approximately the same distance from the source as the substrates.

4. In order to provide access for changing and removing substrates, the changer/heater should be easily removable.

An optical device such as a blocking filter may utilize thirty layers of material to provide a 10 nm wide bandwidth. Blocking filters can be used to block various ranges of radiation ranging from infrared to X-rays.

Numerous devices have been developed by others to provide witness chip changing capability to optical coating systems. The most common type of witness chip changer utilizes cassettes, which are generally unreliable, complicated, and often a poor match up to the substrate/changer heating system and being incompatible with current vacuum system technology.

Substrate and witness window heating is most commonly accomplished by either quartz or resistance radiant heaters. Quartz radiant heaters by their nature are bulky, provide uneven heating, interfere mechanically with mechanisms and tend to do significant thermal damage to mechanical system components. Resistance heaters have a tendency to fail to provide uniform substrate heating.

SUMMARY OF THE INVENTION

Another object of this invention is to provide for a new and improved apparatus for evaporating a plurality of layers of various substances upon a substrate in which the apparatus is compatible with other portions of an evaporating system, is relatively simple, and is reliable in its usage.

In accordance with one aspect of the invention, apparatus for evaporating a plurality of layers of various substances upon a substrate includes a plurality of square witness chips. Each chip has primary dimensions $a$ by $a$ by $t$ wherein $a$ represents the length of a side of one of the chips and $t$ represents the thickness thereof. Right-angled corners of the chips correspond to vertices thereof. A witness chip holder has an axial hole vertically disposed through its central axis. The axial hole has a cross-sectional shape corresponding to the external configuration of an octagram, wherein recesses of right-angled vertices of the octagram are formed in the axial hole. Each witness chip is rotatably stacked within alternate formed verticular recesses of the octagrammatic hole. The chip holder has a cylindrical base. A drum with a square hole at its base has a cylindrical recess therein for receiving the cylindrical base of the witness chip holder for reciprocating movement therewithin. The square hole has a side $b$ such that $a<b<\sqrt{2}a$, whereby the lowermost witness chip of the stack of chips is held at its vertices by the base of the drum. A Geneva mechanism rotates the holder with respect to the drum so as to eject, one at a time, the witness chips through the square hole of the drum. Means are provided for simultaneously evaporating one of the various substances onto both the substrate and the lowermost witness chip held by the drum. Means are provided for directing a beam of radiation to be either reflected from or transmitted through the witness chips stacked in the chip holder. Means are provided for detecting either the reflected or transmitted beam of radiation as it is optically altered by an evaporated coating on the lowermost witness chips. A toroidal-shaped heating element has an inner diameter and an outer diameter forming an annulus that is wrapped with sets of heating wire, wherein each set of heating wire includes turns of wire adjacent to each other that are oriented parallel to each other. In accordance with certain features of the invention, the heating wire can comprise tantalum. The annulus is wrapped with eight sets of heating wire, each set of heating wire including a like number of turns.

In accordance with another aspect of the invention, apparatus for evaporating a plurality of layers of various substances upon a substrate includes a plurality of square witness chips. Each witness chip has primary dimensions $a$ by $a$ by $t$, wherein a represents the length of a side of one of the chips and t represents the thickness thereof. Right-angled corners of the chips correspond to vertices thereof. A witness chip holder has an axial hole vertically disposed through a central axis thereof. The axial hole has a cross-sectional shape having a first set of four radially disposed right-angled recesses therein oriented to form a first square receptacle for receiving some of the witness chips with the recesses oriented equidistant from each other and oriented along a common fixed radius from the central axis. The axial hole further has a second set of four radially disposed right-angled recesses therein oriented to form a second square receptacle for receiving others of the witness chips with recesses of the second set oriented equidistant from each other and oriented a common fixed radius from the central axis. The axial hole has a cross-sectional shape corresponding to the external configuration of an octoploid wherein recesses of right-angled vertices of the octoploid are formed in the axial hole. Each of the witness chips is rotatably stacked within alternated formed verticular recesses of the octoploidal hole. The chip holder has a cylindrical base. A drum with a square hole at its base has a cylindrical recess therein for receiving the cylindrical base of the witness chip holder for reciprocating movement therewithin. The square hole has a side b such that $a<b<\sqrt{2}\,a$, whereby the lowermost witness chip of a stack of chips is held at its vertices by the base of the drum. A Geneva mechanism is provided for rotating the holder with respect to the drum so as to eject, one at a time, the witness chips through the square hole of the drum. Means are provided for simultaneously evaporating one of the various substances onto both the substrate and the lowermost witness chip held by the drum. Means are provided for directing a beam of radiation through the witness chips stacked in the chip holder. Means detect the specific transmissibility of the radiation through the stacked chips. Further, a toroidal-shaped heating element has an inner diameter and an outer diameter that forms an annulus, which is wrapped with sets of heating wire, wherein each set of heating wire includes turns of wire adjacent to each other that are oriented parallel to each other. In accordance with certain features, the heating wire comprises tantalum. The annulus is wrapped with eight sets of heating wire, each set of heating wire including a like number of turns.

In accordance with yet still another aspect of the invention, apparatus for evaporating a plurality of layers of various substances upon a substrate includes a plurality of square witness chips. Each witness chip has a primary dimension a by a by t wherein a represents the length of a side of one of the chips and t represents the thickness thereof. Right-angled corners of the chips correspond to vertices thereof. A witness chip holder has an axial hole vertically disposed through a central axis thereof. The axial hole has a cross-sectional shape having n sets of four radially disposed right-angled recesses therein oriented to form respective square receptacles for receiving the witness chips with the recesses of a respective one of the sets oriented equidistant from each other and oriented a common fixed radius from the central axis. The axial hole has a cross-sectional shape corresponding to the external configuration of n identical squares superimposed upon each other along its central axis but angularly displaced from each other wherein recesses of right-angled vertices of the square receptacles are formed in the axial hole, each witness chip being rotatably stacked within alternated formed verticular recesses of the hole. The chip holder has a cylindrical base; n is an integer greater than 1. A drum has a square hole at its base and has a cylindrical recess therein for receiving the cylindrical base of the witness chip holder for rotational movement therewithin. The square hole has a side b such that $a<b<\sqrt{2}\,a$, whereby the lowermost witness chip of a stack of chips is held at its vertices by the base of the drum. A Geneva mechanism rotates the holder with respect to the drum so as to eject, one at a time, the witness chips through the square hole of the drum. Means are provided for simultaneously evaporating one of the various substances onto both the substrate and the lowermost witness chip held by the drum. Means are provided for directing a beam of radiation to be either reflected from or transmitted through the witness chips stacked in the chip holder. Means detect either the reflected or transmitted beam of radiation as it is optically altered by an evaporated coating on the lowermost witness chips. A toroidal-shaped heating element has an inner diameter and an outer diameter that forms an annulus that is wrapped with sets of heating wire, wherein each set of heating wire includes turns of wire adjacent to each other that are parallel to each other. In accordance with certain features of the invention, n can be equal to two. The heating wire can comprise tantalum. The annulus can be wrapped with eight sets of heating wire wherein each set of heating wire includes a like number of turns.

BRIEF DESCRIPTION OF THE DRAWINGS

Other objects, advantages and features of this invention, together with its construction and mode of operation, will become more apparent from the following description, when read in conjunction with the accompanying drawings, in which.

LEXICOGRAPHY

The following terminology may be helpful for an understanding of the invention:

duodecigon n. A twelve-sided polygon.

duodecigram n. A twelve-pointed star, formed by extending each of the sides of a regular duodecigon into three squares.

duodeciploidal adj. Twelvefold in appearance or arrangement.

octagram n. An eight-pointed star, formed by extending each of the sides of a regular octagon into squares.

octagrammatic adj.

octoploid n. An eight-pointed star, formed by superimposing one square over an identical square, aligned along their common axis, but rotated with respect to each other.

adj. Eight-fold in appearance or arrangement.

quattuorvigintigon n. A twenty-four sided polygon.

quattuorvigintigram n. A twenty-four pointed star formed by connecting every sixth corner of a regular quattuorvigintigon together, forming six squares.

quattuorvigintiploid n. Twenty-fourfold in appearance or arrangement.

sexadecigon n. A sixteen-sided polygon.

sexadecigram n. A sixteen-pointed star formed by connecting every fourth corner of a regular sexadecigon together, forming four squares.

sexadeciploidal adj. Sixteen-fold in appearance or arrangement.

vertices n. Corners of a planar figure.

verticular adj. Of or pertaining to the vertices.

vigintiploidal adj. Twenty-fold in appearance or arrangement.

DESCRIPTION OF PREFERRED EMBODIMENTS

Figure 1:
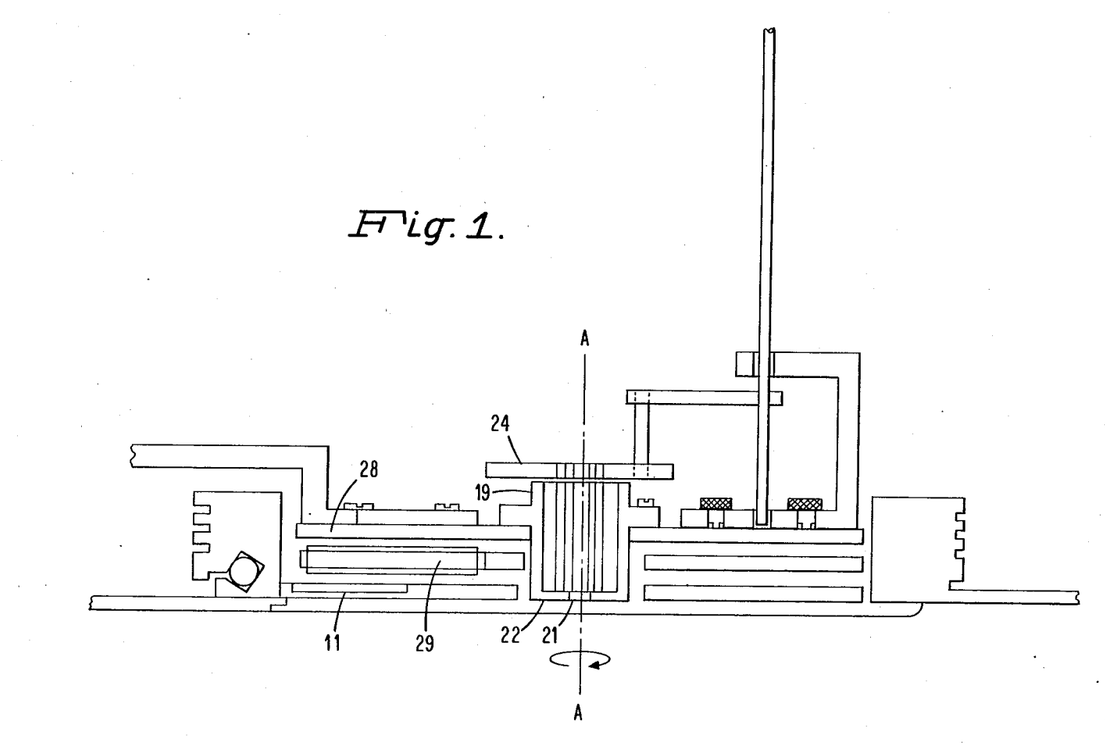
FIG. 1 is a cross sectional elevational view of one embodiment of the invention.
Figure 2:
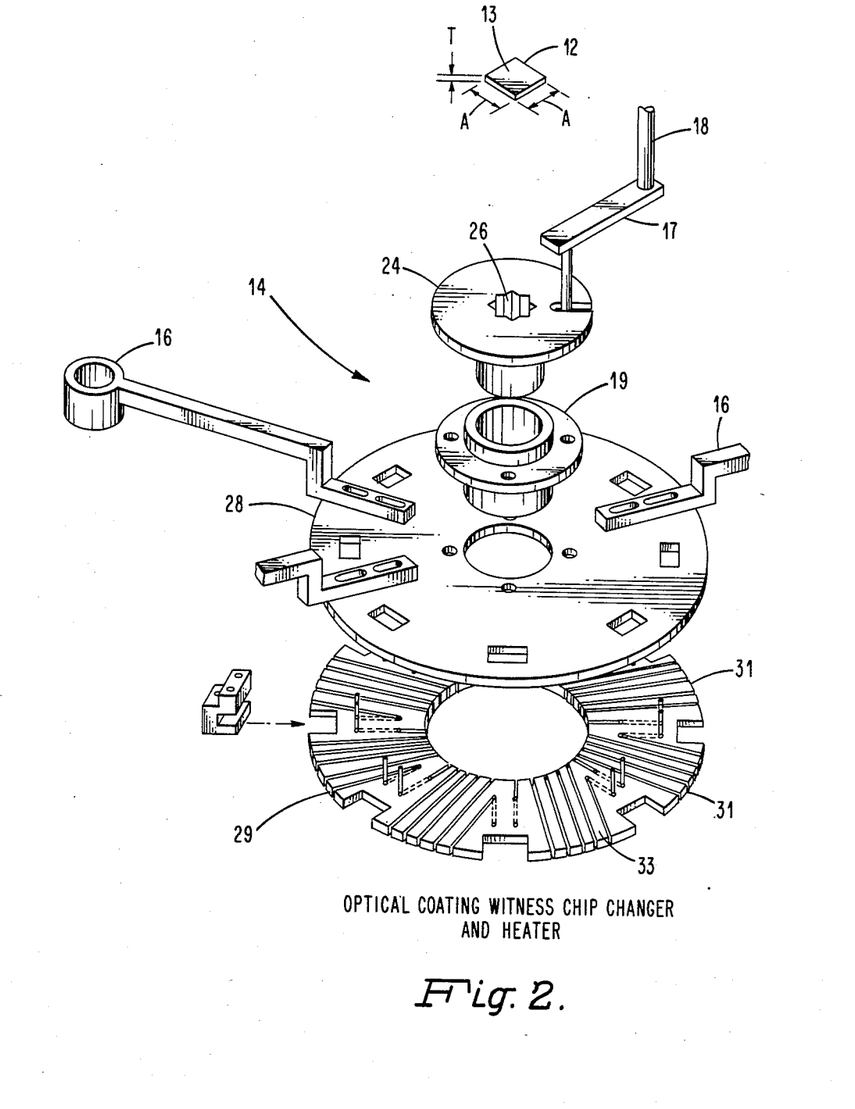
FIG. 2 is an exploded view of portions thereof.
Figure 3:
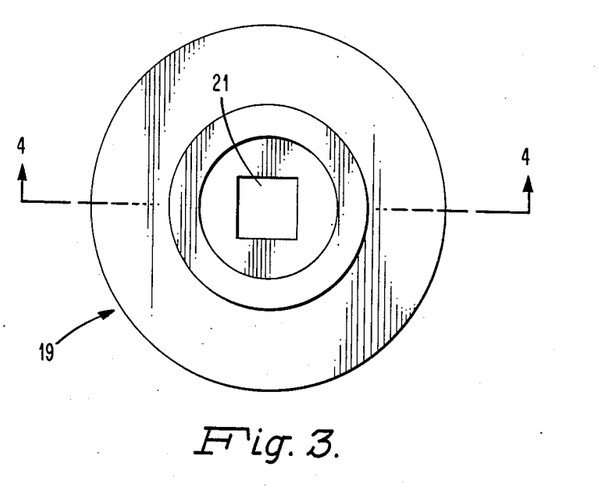
FIG. 3 is a top view of a drum, utilized in an embodiment of the invention, for receiving a witness chip holder therewithin.
Figure 4:
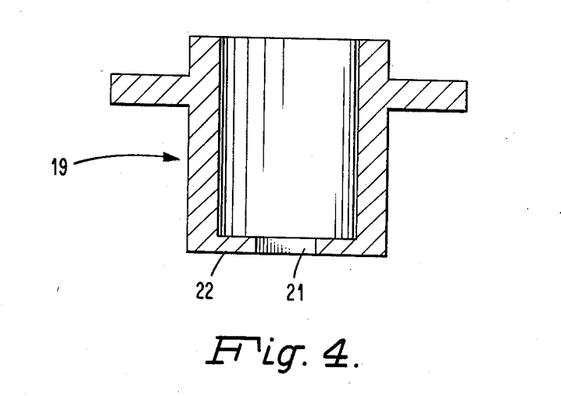
FIG. 4 is a cross-sectional view of the drum depicted in FIG. 3 taken along the lines 4—4 thereof.

Referring to FIG. 1 there is depicted, generally, an elevational view of apparatus for evaporating a plurality of layers of various substances upon substrates. It includes a substrate holding carousel 11 with the substrates therein (not shown) located about the circumference thereof positioned above an evaporation source (not shown) and rotating about a vertical axis A—A coincident with the axis of the carousel 11. A witness chip 12 (see FIG. 2) is positioned with its flat surface 13 coplanar to the substrates (not shown) held on the carousel 11. The witness chip 12 is positioned at the center of the carousel 11 along the axis A—A. Thus, the chip 12 is positioned at the same average distance from the source as the rotating substrates. A heater chip changer mechanism 14, best shown in exploded view in FIG. 2, is suspended from vertical linear bearings 16—16 to provide for easy removal of the system 14 to provide access to the substrates without danger of losing alignment of the changer 14 to the optical monitor path. The changer mechanism 14 can be activated by a Geneva crank 17 which is driven by an oscillating shaft 18 passing through a vacuum feed-through in the top of the vacuum chamber (not shown).

The changer mechanism 14 includes a hollow drum 19 with a square through hole 21 in its base 22.

In an operable embodiment of the invention, a square hole can be 0.01 inch larger on each side than the witness chip.

A cylindrical witness chip holder 24, placed into the drum 19, rests on the base 22 thereof. The center of the cylindrical chip holder 24 contains a through hole 26 in the shape of an octoploidal star with a point to point distance being 0.01 inch greater than the diagonal measurement of the witness chip 12. The witness chips 12—12 are stacked in the octoploidal star with the diagonals of the chip monitoring surfaces offset to one another by 45° and perpendicular to the axis of the star. When the loaded chip holder 24 is rotated 45° relative to the drum 19, the lowermost chip aligns itself with the square hole 21 in the base 22 of the drum 19 and drops through to a collector (not shown), permitting the chip to be removed from the optical path and, in turn, permitting a fresh surface of the next chip to be exposed to the coating media. A 45° reverse rotation of the chip holder 24 allows a subsequent chip to align itself with the square hole 21 in the drum 19 and drop out of the monitor optical path. The sequence is repeated each time a fresh monitoring surface is desired. The changer mechanism 14 is mounted on a thermally conductive disk 28, which serves as a radiation shield to reduce heat loss to the upper part of the chamber, a thermal path to heat the witness chips and a frame for the system.

A radiant heater 29 (see FIGS. 1 and 2) is suspended from the thermal disk 28 directly above the rotating substrate holder 11. The heater 29 includes eight tantalum wire heaters 31-31, equispaced about the circumference of a quartz disk. Each heater 31 contains eight dimensionally parallel loops 33—33 equispaced from each other. The parallel spacing of the heater loops 33—33 is of particular importance in order to provide uniform substrate heating as measured radially from the center of rotation across the substrate.

Various modifications can be performed without departing from the spirit and scope of this invention. For example, as described hereinabove, the witness chip holder 24 is oscillated to and fro about a 45° angle so as to eject one witness chip 12 at a time. However, as an alternative, the witness chip holder can be rotated in one direction (clockwise or counter clockwise as desired) to eject chips 12 one at a time.

Figure 5:
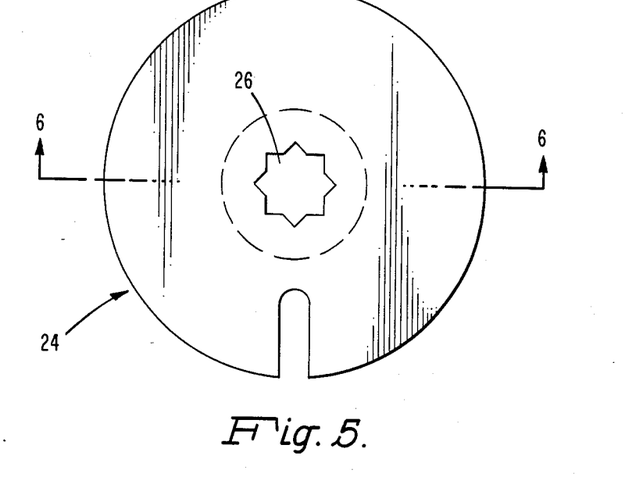
FIG. 5 is top view of the witness chip holder shown in FIGS. 1 and 2, the dotted outline representing a cylindrical base of the witness chip holder.
Figure 6:
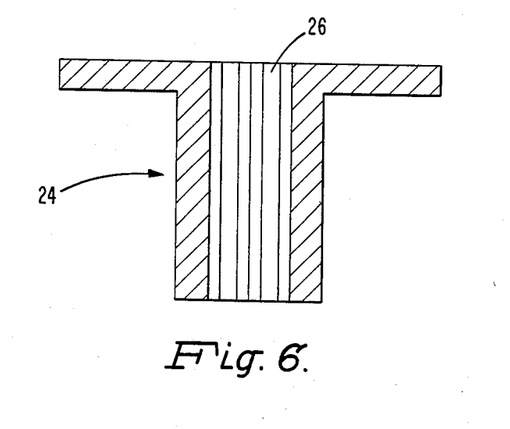
FIG. 6 is a cross-sectional view of the witness chip holder depicted in FIG. 5 taken along the lines 6—6 thereof.

While the outline of an octagram has been selected for the hole 26 configuration of the witness chip holder 24, as depicted in FIG. 5, other configurations are acceptable.

Figures 7, 9:
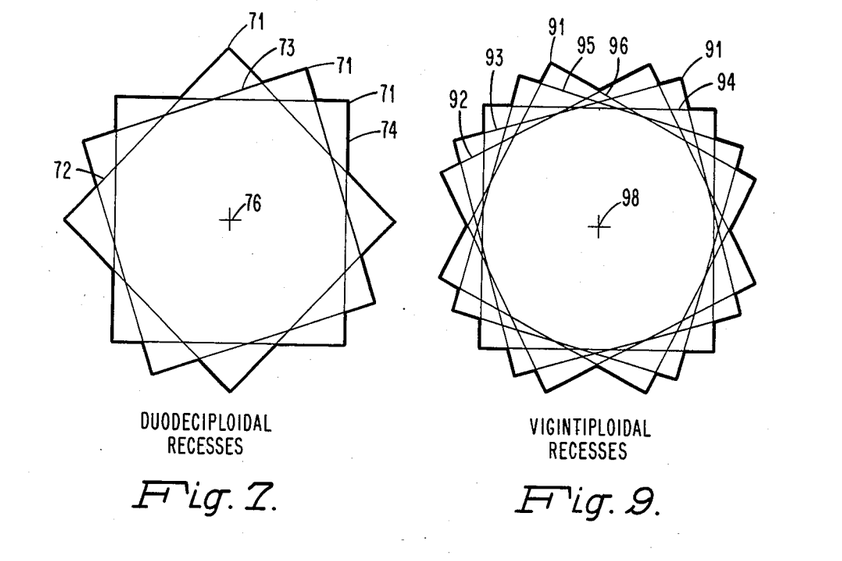
FIGS. 7, 8, 9, and 10 shown alternative shapes of an axial hole for the witness chip holder utilized in this invention.

Referring to FIG. 7, there is depicted duodeciploidal recesses 71—71 which are the vertices of four identical squares 72, 73, 74. The three squares 72, 73, 74 have the same dimensions and are superimposed upon each other about its common center 76.

Figures 8, 10:
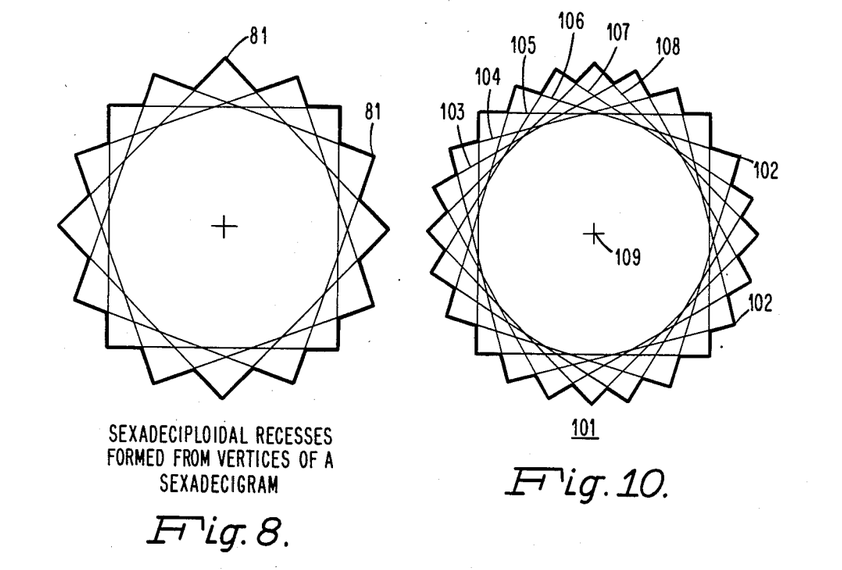

FIG. 8 depcits the sexadeciploidal recesses 81—81 for forming the configuration of an alternative hole 26 for the chip holder 24. The recesses 81—81 are formed from the vertices of a sexadecigram. It is noted that all of the sexadeciploidal recesses 81—81 of FIG. 8 and all of the duodeciploidal recesses 71—71 of FIG. 7 are rectangular in configuration as each of those recesses are formed from the corners of a square.

FIG. 9 depicts vigintiploidal recesses 91—91 suitable as an alternative for the configuration of the hole 26 of the chip holder 24. The vigintiploidal recesses 91—91 are formed from the corners of five identical squares 92, 93, 94, 95, and 96 which are superimposed upon each other about their common axis 98.

FIG. 10 depicts another configuration 101 of a hole 26 of the chip holder 24. The configuration 21 represents the outline of a regular quattuorvigintigram. A quattuorvigintiploid in general can be used; however, with an orifice having twenty-four recesses it is preferable that they be oriented at the vertices of a regular quattuorvigintigon. It is preferable, highly desirable, that each of the recesses 102—102 be recctangular in shape so as to adequately house the square chips. The figure depicted in FIG. 10 is formed by orienting six identical squares 103, 104, 105, 106, 107 108 about a common axis 109.

What is claimed is:

1. Apparatus for evaporating a plurality of layers of various substances upon a substrate comprising
   (a) a plurality of square witness chips, each of said witness chips having primary dimensions $a$ by $a$ by $t$ wherein a represents the length of a side of one of said chips and $t$ represents the thickness thereof, right-angled corners of said chips corresponding to vertices thereof;
   (b) a witness chip holder having an axial hole vertically disposed through a central axis thereof, said axial hole having a cross-sectional shape corresponding to the external configuration of an octagram wherein recesses of right-angled vertices of said octagram are formed in said axial hole, each of said witness chips being rotatably stacked within alternate formed verticular recesses of said octagrammatic hole, said chip holder having a cylindrical base;

(c) a drum having a square hole at the base thereof, and having a cylindrical recess therein for receiving said cylindrical base of said witness chip holder for reciprocating movement therewithin, said square hole having a side $\underline{b}$ such that $a < b < \sqrt{2}\,a$, whereby the lowermost witness chip of a stack of chips is held at its vertices by the base of said drum;

(d) a Geneva mechanism for rotating said holder with respect to said drum so as to eject, one at a time, said witness chips through said square hole of said drum;

(e) means for simultaneously evaporating one of said various substances onto both said substrate and said lowermost witness chip held by said drum;

(f) means for directing a beam of radiation transmitted through said witness chips stacked in said chip holder;

(g) means for detecting said transmitted beam of radiation as it is optically altered by an evaporated coating on said witness chips; and (h) a toroidal-shaped heating element having an inner diameter and an outer diameter, forming an annulus, said annulus being wrapped with sets of heating wire, wherein each set of heating wire includes turns of wire adjacent to each other being oriented parallel to each other.

2. The apparatus as recited in claim 1 wherein said heating wire comprises tantalum.

3. The apparatus as recited in claim 1 wherein said annulus is wrapped with eight sets of heating wire, each set of heating wire including a like number of turns.

4. Apparatus for evaporating a plurality of layers of various substances upon a substrate comprising (a) a plurality of square witness chips, each of said witness chips having primary dimensions a by a by t wherein a represents the length of a side of one of said chips and t represents the thickness thereof, right-angled corners of said chips corresponding to vertices thereof;

(b) a witness chip holder having an axial hole vertically disposed through a central axis thereof, said axial hole having a cross-sectional shape corresponding to the external configuration of an octagram wherein recesses of right-angled vertices of said octagram are formed in said axial hole, each of said witness chips being rotatably stacked within alternate formed verticular recesses of said octagrammatic hole, said chip holder having a cylindrical base;

(c) a drum having a square hole at the base thereof, and having a cylindrical recess therein for receiving said cylindrical base of said witness chip holder for reciprocating movement therewithin, said square hole having a side b such that $a < b < \sqrt{2}\,a$, whereby the lowermost witness chip of a stack of chips is held at its vertices by the base of said drum;

(d) a Geneva mechanism for rotating said holder with respect to said drum so as to eject, one at a time, said witness chips through said square hole of said drum;

(e) means for simultaneously evaporating one of said various substances onto both said substrate and said lowermost witness chip held by said drum;

(f) means for directing a beam of radiation to be reflected from said witness chips stacked in said chip holder;

(g) means for detecting the reflected beam of radiation as it is optically altered by an evaporated coating on said witness chips; and (h) a toroidal-shaped heating element having an inner diameter and an outer diameter, forming an annulus, said annulus being wrapped with sets of heating wire, wherein each set of heating wire includes turns of wire adjacent to each other being oriented parallel to each other.

5. The apparatus as recited in claim 4 wherein said heating wire comprises tantalum.

6. The apparatus as recited in claim 4 wherein said annulus is wrapped with eight sets of heating wire, each set of heating wire including a like number of turns.

7. Apparatus for evaporating a plurality of layers of various substances upon a substrate comprising (a) a plurality of square witness chips, having primary dimensions $\underline{a}$ by $\underline{a}$ by $\underline{t}$ wherein $\underline{a}$ represents the length of a side of one of said chips and t represents the thickness thereof, right-angled corners of said chips corresponding to vertices thereof;

(b) a witness chip holder having an axial hole vertically disposed through a central axis thereof, said axial hole having a cross-sectional shape having a first set of four radially disposed right-angled recesses therein oriented to form a first square receptacle for receiving some of said witness chips with said recesses oriented equidistant from each other and oriented along a common fixed radius from said central axis, said axial hole further having a second set of four radially disposed right-angled recesses therein oriented to form a second square receptacle for receiving others of said witness chips with said recesses of said second set oriented equidistant from each other and oriented said common fixed radius from said central axis, said axial hole having a cross-sectional shape corresponding to the external configuration of an octoploid wherein recesses of right-angled vertices of said octoploid are formed in said axial hole, each of said witness chips being rotatably stacked within alternated formed verticular recesses of said octoploidal hole, said chip holder having a cylindrical base;

(c) a drum having a square hole at the base thereof, and having a cylindrical recess therein for receiving said cylindrical base of said witness chip holder for reciprocating movement therewithin, said square hole having a side b such that $a < b < \sqrt{2}\,a$, whereby the lowermost witness chip of a stack of chips is held at its vertices by the base of said drum;

(d) a Geneva mechanism for rotating said holder with respect to said drum so as to eject one at a time of said witness chip through said square hole of said drum;

(e) means for simultaneously evaporating one of said various substances onto both HbvHaid substrate and said lowermost witness chip held by said drum;

(f) means for directing a beam of radiation to be transmitted through said witness chips stacked in said chip holder;

(g) means for detecting optical changes in the transmitted beam of radiation as the witness chip is coated by an evaporant; and (h) a toroidal-shaped heating element having an inner diameter and an outer diameter, forming an annulus, said annulus being wrapped with sets of heating wire, wherein each set of heating wire includes turns of wire adjacent to each other being oriented parallel to each other.

8. The apparatus as recited in claim 7 wherein said heating wire comprises tantalum.

9. The apparatus as recited in claim 7 wherein said annulus is wrapped with eight sets of heating wire, each set of heating wire including a like number of turns.

10. Apparatus for evaporating a plurality of layers of various substances upon a substrate comprising (a) a plurality of square witness chips, having primary dimensions a by a by t wherein a represents the length of a side of one of said chips and t represents the thickness thereof, right-angled corners of said chips corresponding to vertices thereof;

(b) a witness chip holder having an axial hole vertically disposed through a central axis thereof, said axial hole having a cross-sectional shape having a first set of four radially disposed right-angled recesses therein oriented to form a first square receptacle for receiving some of said witness chips with said recesses oriented equidistant from each other and oriented along a common fixed radius from said central axis, said axial hole further having a second set of four radially disposed right-angled recesses therein oriented to form a second square receptacle for receiving others of said witness chips with said recesses of said second set oriented equidistant from each other and oriented said common fixed radius from said central axis, said axial hole having a cross-sectional shape corresponding to the external configuration of an octoploid wherein recesses of right-angled vertices of said octoploid are formed in said axial hole, each of said witness chips being rotatably stacked within alternated formed verticular recesses of said octoploidal hole, said chip holder having a cylindrical base;

(c) a drum having a square hole at the base thereof, and having a cylindrical recess therein for receiving said cylindrical base of said witness chip holder for reciprocating movement therewithin, said square hole having a side $\underline{b}$ such that $a<b<\sqrt{2}\,a$, whereby the lowermost witness chip of a stack of chips is held at its vertices by the base of said drum;

(d) a Geneva mechanism for rotating said holder with respect to said drum so as to eject one at a time of said witness chip through said square hole of said drum;

(e) means for simultaneously evaporating one of said various substances onto both said substrate and said lowermost witness chip held by said drum;

(f) means for directing a beam of radiation to be reflected through said witness chips stacked in said chip holder;

(g) means for detecting optical changes in the reflected beam of radiation as the witness chip is coated by an evaporant; and (h) a toroidal-shaped heating element having an inner diameter and an outer diameter, forming an annulus, said annulus being wrapped with sets of heating wire, wherein each set of heating wire includes turns of wire adjacent to each other being oriented parallel to each other.

11. The apparatus as recited in claim 10 wherein said heating wire comprises tantalum.

12. The apparatus as recited in claim 10 wherein said annulus is wrapped with eight sets of heating wire, each set of heating wire including a like number of turns.

13. Apparatus for evaporating a plurality of layers of various substances upon a substrate comprising (a) a plurality of square witness chips, having primary dimensions a by a by t wherein a represents the length of a side of one of said chips and t represents the thickness thereof, right-angled corners of said chips corresponding to vertices thereof;

(b) a witness chip holder having an axial hole vertically disposed through a central axis thereof, said axial hole having a cross-sectional shape having n sets of four radially disposed right-angled recesses therein oriented to form respective square receptacles for receiving said witness chips with said recesses of a respective one of said sets oriented equidistant from each other and oriented a common fixed radius from said central axis, said axial hole having a cross-sectional shape corresponding to the external configuration of n identical squares superimposed upon each other along its central axis but angularly displaced from each other wherein recesses of right-angled vertices of said square receptacles are formed in said axial hole, each of said witness chips being rotatably stacked within alternated formed verticular recesses of said hole, said chip holder having a cylindrical base, n being an integer greater than 1;

(c) a drum having a square hole at the base thereof, and having a cylindrical recess therein for receiving said cylindrical base of said witness chip holder for rotational movement therewithin, said square hole having a side $\underline{b}$ such that $a<b<\sqrt{2}\,a$, whereby the lowermost witness chip of a stack of chips is held at its vertices by the base of said drum;

(d) a Geneva mechanism for rotating said holder with respect to said drum so as to eject one at a time of said witness chips through said square hole of said drum;

(e) means for simultaneously evaporating one of said various substances onto both said substrate and said lowermost witness chip held by said drum;

(f) means for directing a beam of radiation to be transmitted through said witness chips stacked in said chip holder;

(g) means for detecting optical changes in the transmitted beam of radiation as the witness chip is coated by an evaporant; and (h) a toroidal-shaped heating element having an inner diameter and an outer diameter, forming an annulus, said annulus being wrapped with sets of heating wire, wherein each set of heating wire includes turns of wire adjacent to each other being parallel to each other.

14. The apparatus as recited in claim 13 wherein n equals two.

15. The apparatus as recited in claim 13 wherein said heating wire comprises tantalum.

16. The apparatus as recited in claim 13 wherein said annulus is wrapped with eight sets of heating wire, each set of heating wire including a like number of turns.

17. Apparatus for evaporating a plurality of layers of various substances upon a substrate comprising
 (a) a plurality of square witness chips, having primary dimensions $a$ by $a$ by $t$ wherein $a$ represents the length of a side of one of said chips and $t$ represents the thickness thereof, right-angled corners of said chips corresponding to vertices thereof;
 (b) a witness chip holder having an axial hole vertically disposed through a central axis thereof, said axial hole having a cross-sectional shape having n sets of four radially disposed right-angled recesses therein oriented to form respective square receptacles for receiving said witness chips with said recesses of a respective one of said sets oriented equidistant from each other and oriented a common fixed radius from said central axis, said axial hole having a cross-sectional shape corresponding to the external configuration of n identical squares superimposed upon each other along its central axis but angularly displaced from each other wherein recesses of right-angled vertices of said square receptacles are formed in said axial hole, each of said witness chips being rotatably stacked within alternated formed verticular recesses of said hole, said chip holder having a cylindrical base, n being an integer greater than 1;
 (c) a drum having a square hole at the base thereof, and having a cylindrical recess therein for receiving said cylindrical base of said witness chip holder for rotational movement therewithin, said square hole having a side b such that $a<b<\sqrt{2}\,a$, whereby the lowermost witness chip of a stack of chips is held at its vertices by the base of said drum;
 (d) a Geneva mechanism for rotating said holder with respect to said drum so as to eject one at a time of said witness chips through said square hole of said drum;
 (e) means for simultaneously evaporating one of said various substances onto both said substrate and said lowermost witness chip held by said drum;
 (f) means for directing a beam of radiation to be reflected through said witness chips stacked in said chip holder;
 (g) means for detecting optical changes in the reflected beam of radiation as the witness chip is coated by an evaporant; and
 (h) a toroidal-shaped heating element having an inner diameter and an outer diameter, forming an annulus,
 said annulus being wrapped with sets of heating wire, wherein each set of heating wire includes turns of wire adjacent to each other being parallel to each other.

18. The apparatus as recited in claim 17 wherein n equals two.

19. The apparatus as recited in claim 17 wherein said heating wire comprises tantalum.

20. The apparatus as recited in claim 17 wherein said annulus is wrapped with eight sets of heating wire, each set of heating wire including a like number of turns.

* * * * *